United States Patent
Chang

(10) Patent No.: US 9,639,203 B2
(45) Date of Patent: May 2, 2017

(54) TOUCH CONTROL DETECTION SYSTEM, DELTA-SIGMA MODULATOR AND MODULATING METHOD THEREOF

(71) Applicant: Novatek Microelectronics Corp., Hsinchu (TW)

(72) Inventor: Chih-Yuan Chang, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 48 days.

(21) Appl. No.: 14/582,215

(22) Filed: Dec. 24, 2014

(65) Prior Publication Data
US 2016/0126972 A1 May 5, 2016

(30) Foreign Application Priority Data
Nov. 3, 2014 (TW) .............................. 103138054 A

(51) Int. Cl.
*G06F 3/041* (2006.01)
*H03M 3/00* (2006.01)

(52) U.S. Cl.
CPC .......... *G06F 3/0416* (2013.01); *H03M 3/396* (2013.01); *H03M 3/422* (2013.01); *H03M 3/438* (2013.01); *H03M 3/458* (2013.01)

(58) Field of Classification Search
CPC .......... G06F 3/0416; H03M 1/12; H03M 3/00; H03M 3/32; H03M 3/464; H03M 3/354
See application file for complete search history.

(56) References Cited

U.S. PATENT DOCUMENTS

| | | | |
|---|---|---|---|
| 9,077,366 B2* | 7/2015 | Jensen ................. | H03M 1/201 |
| | | | 341/143 |
| 2002/0171572 A1 | 11/2002 | Yamamoto | |
| 2008/0165042 A1 | 7/2008 | Hochschild | |
| 2011/0063154 A1* | 3/2011 | Hotelling ............. | H03M 3/494 |
| | | | 341/143 |
| 2011/0095925 A1* | 4/2011 | Matsumoto ........... | H03M 3/332 |
| | | | 341/143 |
| 2011/0175761 A1 | 7/2011 | Zare-Hoseini | |

OTHER PUBLICATIONS

"Office Action of Taiwan Counterpart Application", issued on Mar. 9, 2016, p. 1-p. 5.

* cited by examiner

*Primary Examiner* — Kevin M Nguyen
(74) *Attorney, Agent, or Firm* — Jianq Chyun IP Office

(57) ABSTRACT

A touch control detection system, a delta-sigma modulator and a modulating method thereof are provided. The delta-sigma modulator includes a quantizer and N integrating units. The quantizer generates a modulating result signal. The integrating units are coupled in series. Each of the integrating receives an input signal, and each of the integrating units receives a plurality of gain parameters, N is a positive integer. The quantizer quantizes a signal on an output end of the $N^{th}$ stage integrating unit according to an error signal for generating the modulating result signal. A center frequency of a noise transfer function (NTF) of the delta-sigma modulator is adjusted according to the gain parameters, and the gain parameters are determined according to a frequency of the input signal.

8 Claims, 8 Drawing Sheets

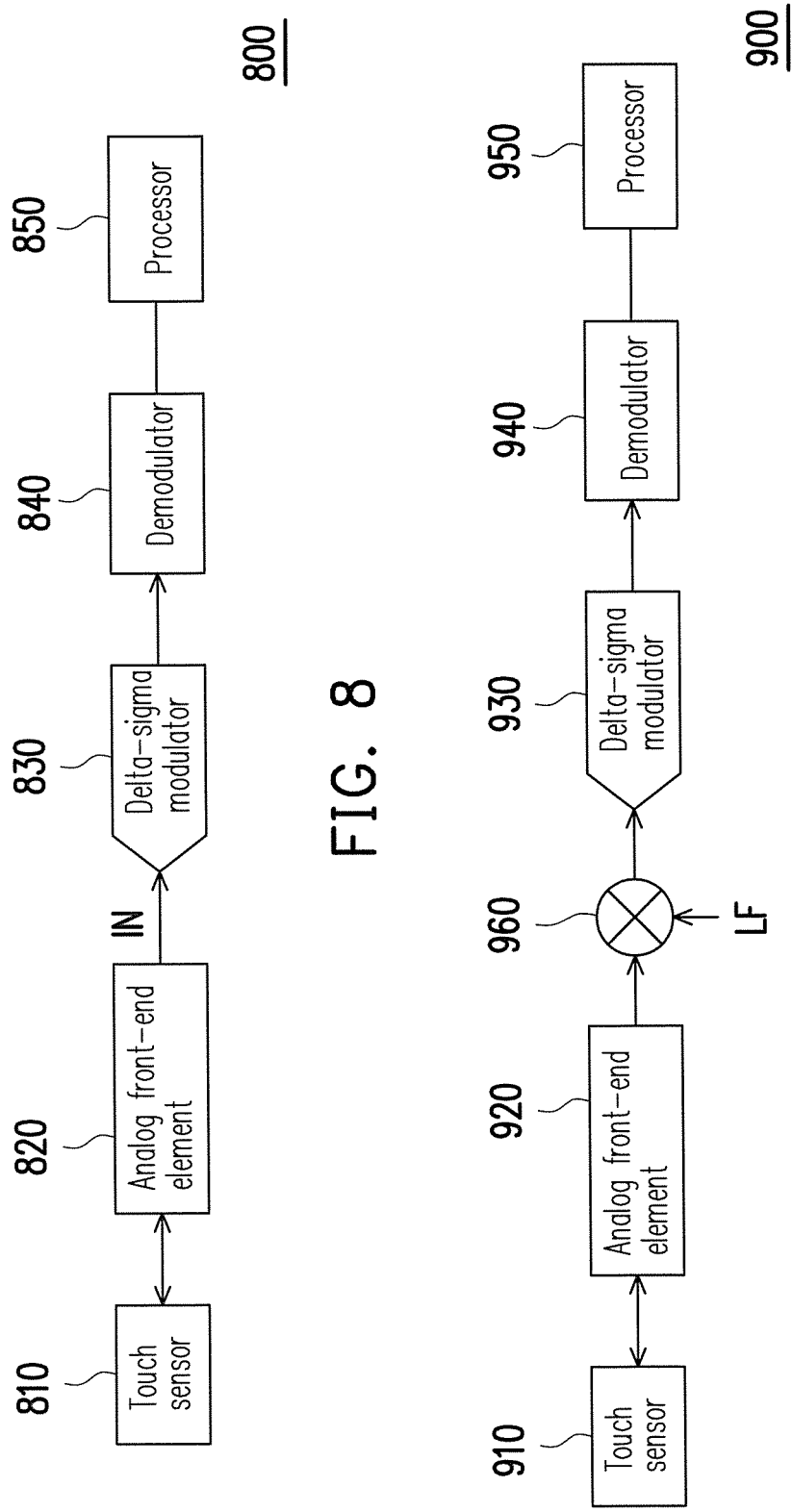

TOUCH CONTROL DETECTION SYSTEM, DELTA-SIGMA MODULATOR AND MODULATING METHOD THEREOF

CROSS-REFERENCE TO RELATED APPLICATION

This application claims the priority benefit of Taiwan application serial no. 103138054, filed on Nov. 3, 2014. The entirety of the above-mentioned patent application is hereby incorporated by reference herein and made a part of this specification.

BACKGROUND OF THE INVENTION

1. Field of the Invention

The invention generally relates to a delta-sigma modulator applied in a touch control detection system and a modulating method thereof, and more particularly, to a delta-sigma modulator capable of adjusting a center frequency of a noise transfer function (NTF) thereof and it's modulating method.

2. Description of Related Art

In the field of conventional art, it is generally required to include an anti-aliasing filter (AAF) in an analog to digital converter for lowering interference of high frequency noise in a system. The anti-aliasing filter is usually a one-stage or multiple-stage active or passive low-pass filter. If under a condition of adopting an analog to digital converter of low-pass delta-sigma modulation, then a low pass filtering effect may be achieved with the characteristics of a loop filter of the analog to digital converter itself.

When being applied to a touch system, a low frequency noise signal with a frequency band lower than 300 KHz would appear. If the conventional analog to digital converter of low-pass delta-sigma modulation is to be used for filtering out the low frequency noise signal, then a circuit design thereof would become even more complicated, and an area required for circuit layout would be substantially increased. Moreover, power consumption required by the analog to digital converter would also substantially be increased.

SUMMARY OF THE INVENTION

The invention provides a variety of delta-sigma modulators each being capable of adjusting a center frequency of a signal thereof, thereby enhancing an over sampling ratio (OSR) thereof while simultaneously lowering a power consumption of an analog to digital converter.

The invention provides a touch control detection system, whereby an over sampling ratio thereof may be enhanced by adjusting a center frequency of a noise transfer function of a delta-sigma modulator thereof under an appropriate sampling rate.

The invention provides a delta-sigma modulating method, which is capable of enhancing an over sampling ratio while simultaneously achieving an acceptably low power consumption and an acceptable performance.

The delta-sigma modulator of the invention includes a quantizer and N integrating units. The quantizer generates a modulating result signal. The integrating units are coupled in series, wherein each of the integrating units receives an input signal, an output end of the $N^{th}$ stage integrating unit is coupled to an input end of the quantizer, each of the integrating units receives a plurality of gain parameters, and N is a positive integer. The quantizer quantizes a signal on the output end of the $N^{th}$ stage integrating unit according to an error signal for generating the modulating result signal. A center frequency of a noise transfer function of the delta-sigma modulator is adjusted according to the gain parameters, and the gain parameters are determined according to a frequency of the input signal.

Another delta-sigma modulator of the invention includes a first calculation unit, an integrating unit and a quantizer. The first calculation unit performs an arithmetic calculation on an input signal and a modulating result signal to obtain a calculation result signal. The integrating unit includes a second calculation unit and a plurality of delay devices. The second calculation unit generates an integration signal in response to the calculation result signal and a delayed integration signals. The delay devices are coupled in series between an input end and an output end of the second calculation unit, and respectively perform a plurality of delays in response to the integration signal for generating the delayed integration signal. The quantizer receives the integration signal and quantizes the integration signal to generate a modulation result.

The touch control detection system of the invention includes a touch sensor, an analog front-end element, a demodulator, and a delta-sigma modulator as described in the above. The touch sensor generates a touch detection signal. The analog front-end element is coupled to the touch sensor, receives the touch detection signal and generates an input signal. The delta-sigma modulator is coupled to the analog front-end element to receive the input signal, and generates a modulating result signal. The demodulator is coupled to the delta-sigma modulator for performing a demodulating action to the modulating result signal.

The delta-sigma modulating method of the invention includes: determining a plurality of gain parameters according to a frequency of an input signal; providing N integrating units coupled in series for enabling each of the integrating units to perform an integration action to the input signal according to the gain parameters, so as to generate an integration result signal, wherein the gain parameters are used to control a center frequency of a noise transfer function of the delta-sigma modulator for generating the integration result signal; and quantizing the integration result signal according to an error signal to generate a modulating result signal, wherein N is a positive integer.

In view of the above, each of the delta-sigma modulators of the invention is capable of adjusting the center frequency of the noise transfer function thereof; and by adjusting the center frequency of the noise transfer function, the over sampling ratio thereof may still maintain a sufficiently high standard under a state that the input signal being a low-frequency signal, thus maintaining a quality of signal processing. As a result, the frequency of the input signal does not need to be increased, and may effectively lower a required power consumption.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 8 is a schematic diagram illustrating a touch control detection system according to an embodiment of the invention.

FIG. 9 is a schematic diagram illustrating a touch control detection system according to another embodiment of the invention.

DESCRIPTION OF THE EMBODIMENTS

Figure 1:
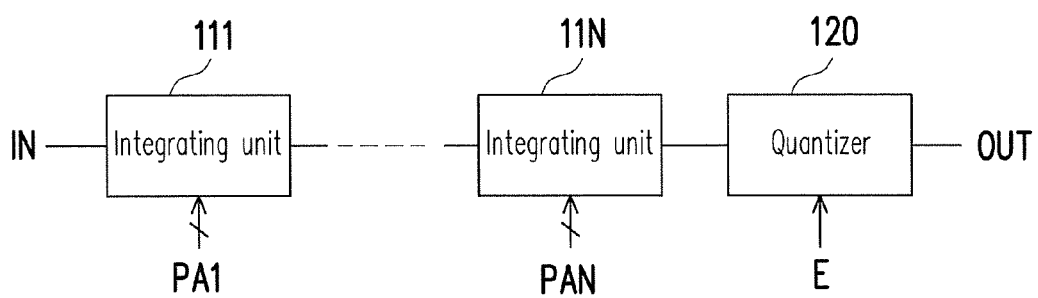
FIG. 1 is a schematic diagram illustrating a delta-sigma modulator according to an embodiment of the invention.

Referring to FIG. 1, FIG. 1 is a schematic diagram illustrating a delta-sigma modulator 100 according to an embodiment of the invention. The delta-sigma modulator 100 receives an analog input signal IN, and modulates the input signal IN to generate a digital modulating result signal OUT. The delta-sigma modulator 100 includes N integrating units 111 to 11N and a quantizer 120. The integrating units 111 to 11N are coupled in series, and the integrating units 111 to 11N respectively receive a plurality of gain parameters PA1 to PAN.

The integrating unit 111 receives the input signal IN, and performs an integration action on the input signal IN according to the gain parameter PA1 received thereby. Then, the integrating units of the successive stages sequentially perform the integration action according to the gain parameters corresponded thereto, and an output end of the integrating unit 11N of the last stage provides an integration result signal generated thereby to the quantizer 120.

The quantizer 120 quantizes a signal on the output end of the $N^{th}$ stage integrating unit 11N according to an error signal E, so as to generate a modulating result signal OUT.

Noteworthily, the gain parameters PA1 to PAN respectively received by the integrating units 111 to 11N may be adjusted. Moreover, by adjusting the gain parameters PA1 to PAN, a center frequency of a noise transfer function of the delta-sigma modulator 100 may be adjusted correspondingly. In detail, taking the integrating unit 111 as an example, through adjusting the gain parameter PA1 received by the integrating unit 111, positions of zeros and poles of the noise transfer function and a signal transfer function (STF) of the delta-sigma modulator 100 may be changed, so that the center frequency of the noise transfer function of the delta-sigma modulator 100 may be adjusted between 0 and half of a sampling frequency.

Adjustments of the gain parameters PA1 to PAN may be performed according to a frequency of the input signal IN. For instance, the gain parameters PA1 to PAN may be adjusted according to a frequency range of the input signal IN. Specifically, a designer may set a plurality of frequency ranges and set a plurality of gain parameters PA1 to PAN corresponding to the frequency ranges; and then selects the corresponding gain parameters PA1 to PAN by determining which frequency range the frequency of the input signal IN falls in, thereby enabling the center frequency of the noise transfer function of the delta-sigma modulator 100 to be dynamically adjusted.

In addition, after adjustment of the center frequency of the noise transfer function, the center frequency of the noise transfer function of the delta-sigma modulator 100 may be raised; and as a result, the sampling frequency does not have to be lowered in correspondence to a low-frequency input signal, and thus an over sampling ratio over the entire system may be maintained above a fixed value.

Figure 2:
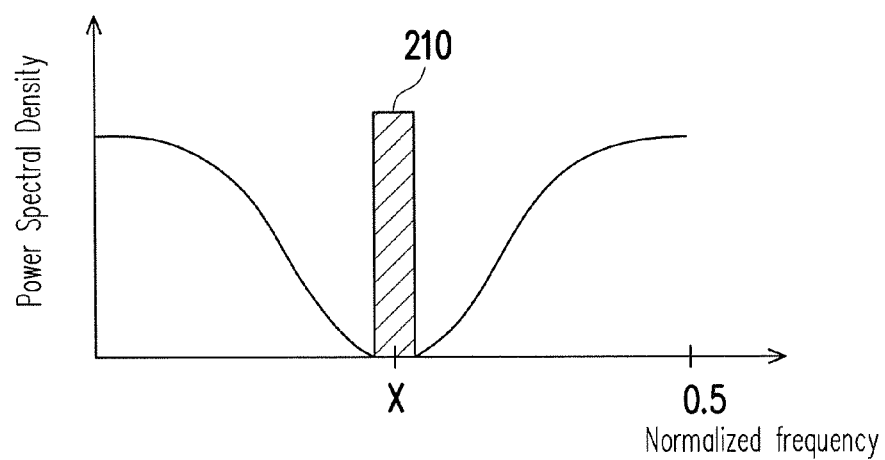
FIG. 2 illustrates a spectrogram of the delta-sigma modulator 100 in the embodiment shown depicted by FIG. 1.

Referring to FIG. 2, FIG. 2 illustrates a spectrogram of the delta-sigma modulator 100 in the embodiment shown depicted by FIG. 1. In FIG. 2, the horizontal axis represents values that are normalized based on the sampling frequency, and the vertical axis represents power spectral densities (PSD), whereby a center frequency of a signal 210 is being modulated to a position x, and x is between a direct current (0) and 0.5 times of the sampling frequency.

Figure 3A:
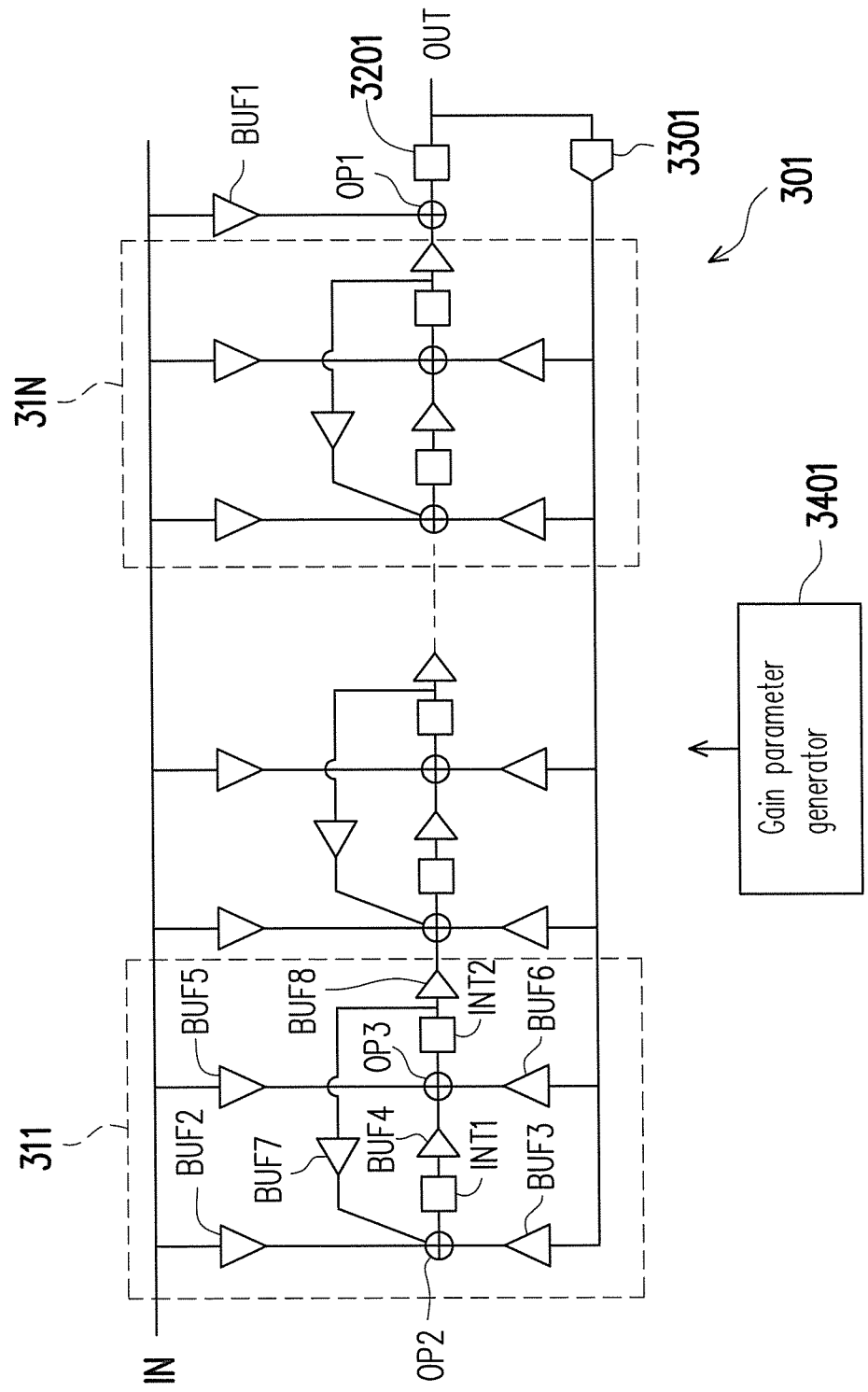
FIG. 3A is a schematic diagram illustrating a delta-sigma modulator according to an embodiment of the invention.

Referring to FIG. 3A, FIG. 3A is a schematic diagram illustrating a delta-sigma modulator 301 according to an embodiment of the invention. The delta-sigma modulator 301 includes N integrating units 311 to 31N, a quantizer 3201, a calculation unit OP1 and a buffer BUF1. The buffer BUF1 adjusts the input signal IN according to a first gain parameter for generating a first buffer signal, and the calculation unit OP1 performs an arithmetic calculation on the first buffer signal and a signal on an output end of the $N^{th}$ stage integrating unit 31N so as to generate an integration result signal, and provides the integration result signal to the quantizer 3201. The quantizer 3201 quantizes a calculation result of the calculation unit OP1, so as to generate a modulating result signal OUT. The calculation unit OP1 may be an adder.

Regarding the implementations of the integrating units 311 to 31N, taking the integrating unit 311 as an example, the integrating unit 311 includes buffers BUF2 to BUF8, integrators INT1 and INT2 and calculation units OP1 and OP2. The buffer BUF2 adjusts the input signal IN according to a second gain parameter for generating a second buffer signal. The buffer BUF3 adjusts the modulating result signal OUT according to a third gain parameter for generating a third buffer signal. The calculation unit OP2 performs an arithmetic calculation on the second buffer signal, the third buffer signal, a seventh buffer signal generated by the buffer BUF7, and an eighth buffer signal generated by the buffer BUF8 of the prior stage integrating unit (if there is a prior stage integrating unit) so as to generate a first calculation result signal.

Moreover, the integrator INT1 integrates the first calculation result signal to generate the first integration result signal. The buffer BUF4 adjusts the first integration result signal according to a fourth gain parameter for generating a fourth buffer signal. The calculation unit OP3 performs an arithmetic calculation on the fourth buffer signal, a fifth buffer signal generated by the buffer BUF5 and a sixth buffer signal generated by the buffer BUF6 so as to generate a second calculation result signal. The fifth buffer signal is being generated as the buffer BUF5 adjusts the input signal IN according to a fifth gain parameter, and the sixth buffer signal is being generated as the buffer BUF6 adjusts the modulating result signal OUT according to a sixth gain parameter.

The buffer BUF7 adjusts a second integration result signal according to a seventh gain parameter for generating a seventh buffer signal, and the buffer BUF8 adjusts the second integration result signal according to an eighth gain parameter for generating an eighth buffer signal. In addition, the eighth buffer signal is provided to the calculation unit OP2 of the next stage integrating unit or the quantizer 3201. Specifically, if the integrating unit is the last stage integrating unit, then the eighth buffer signal thereof would be provided to the quantizer 3201; contrarily, if the integrating unit is not the last stage integrating unit, then the eighth buffer signal thereof would be provided to the calculation unit OP2 of the next stage integrating unit.

In the above descriptions, transfer functions of the integrators INT1 and INT2 are respectively $Z/(Z-1)$ and $1/(Z-1)$, and the calculation units OP1 to OP3 may be adders.

Noteworthily, the first to eighth gain parameters corresponded by the buffers BUF1 to BUF8 may be set according to the frequency of the input signal IN; and in the present embodiment, the first to eighth gain parameters may be provided by the gain parameter generator 3401.

Moreover, the delta-sigma modulator 301 may further include a digital-to-analog converter 3301. The digital-to-analog converter 3301 is coupled between the quantizer 3201 and the integrating units 311 to 31N, and the digital-to-analog converter 3301 is configured to convert the modulating result signal out of a digital format to an analog format.

Figure 3B:
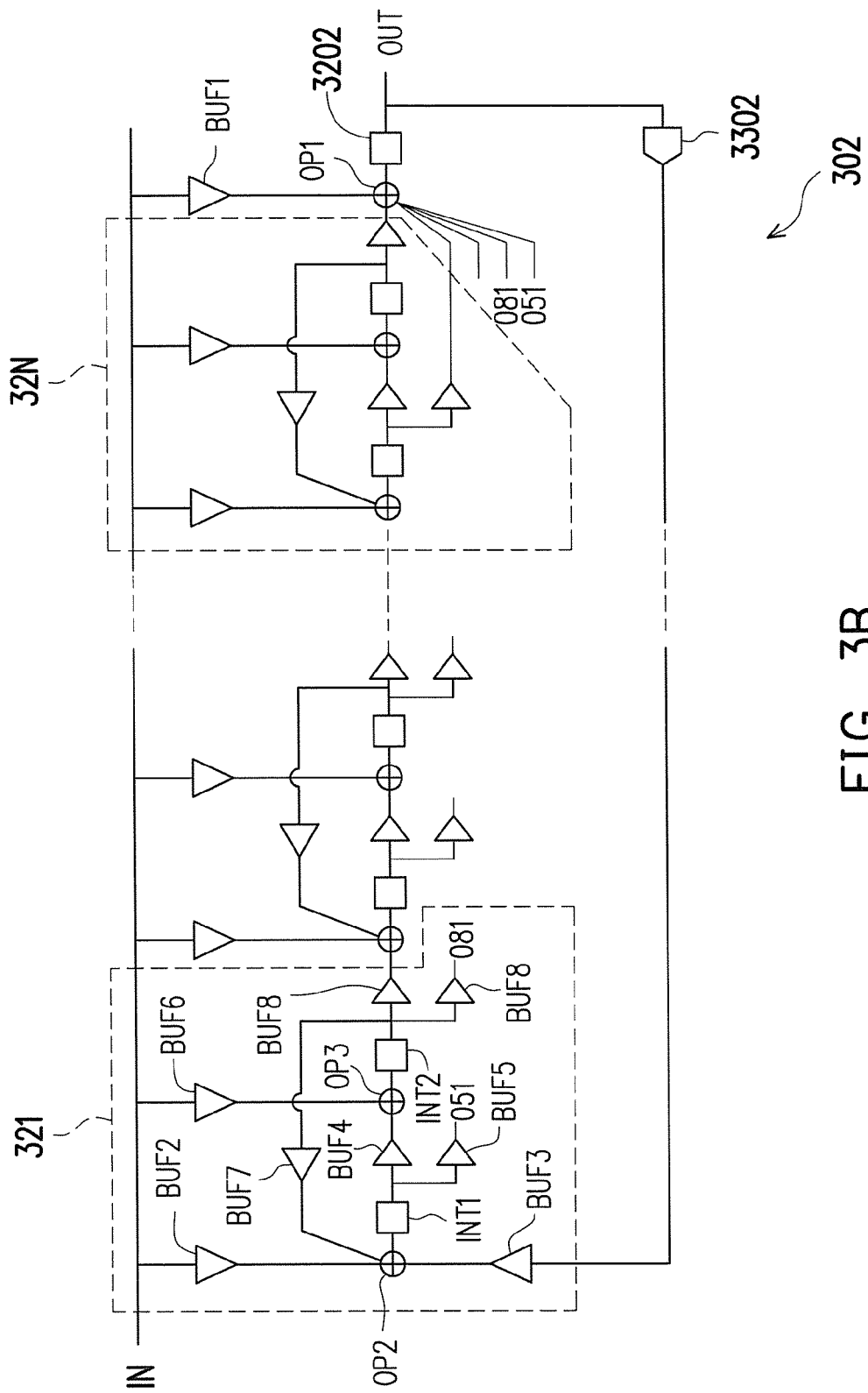
FIG. 3B is a schematic diagram illustrating a delta-sigma modulator according to another embodiment of the invention.

Referring to FIG. 3B, FIG. 3B is a schematic diagram illustrating a delta-sigma modulator 302 according to another embodiment of the invention. The delta-sigma modulator 302 includes N integrating units 321 to 32N, a quantizer 3202, a digital-to-analog converter 3302, a calculation unit OP1, and a buffer BUF1. The buffer BUF1 adjusts an input signal IN according to a first gain parameter for generating a first buffer signal, and the calculation unit OP1 performs an arithmetic calculation on a fifth buffer signal O51 and an eighth buffer signal O81 of each of the integrating units 321 to 32N so as to generate an integration result signal, and provide the integration result signal to the quantizer 3202.

Regarding the implementations of the integrating units 321 to 32N, taking the integrating unit 321 for an example, the integrating unit 321 includes buffers BUF2 to BUF8, integrators INT1 and INT2 and calculation units OP1 and OP2. The buffer BUF2 adjusts an input signal IN according to a second gain parameter for generating a second buffer signal. The buffer BUF3 adjusts a modulating result signal OUT or a second integration result signal of the prior stage integrating unit according to a third gain parameter for generating a third buffer signal. The calculation unit OP performs an arithmetic calculation on the second buffer signal, the third buffer signal and a seventh buffer signal generated by the buffer BUF7, so as to generate a first calculation result signal. The integrator INT1 integrates the first calculation result signal to generate a first integration result signal.

The buffer BUF4 adjusts the first integration result signal according to a fourth gain parameter for generating a fourth buffer signal, the buffer BUF5 adjusts the first integration result signal according to a fifth gain parameter for generating a fifth buffer signal O51, the buffer BUF6 adjusts input signal IN according to a sixth gain parameter for generating a sixth buffer signal, the seventh buffer BUF7 adjusts a second integration result signal according to a seventh gain parameter for generating a seventh buffer signal, and the buffer BUF8 adjusts the second integration result signal according to an eighth gain parameter for generating an eighth buffer signal O81.

The calculation unit OP6 performs an arithmetic calculation on the fourth buffer signal and the sixth buffer signal to generate a second calculation result signal. The integrator INT2 integrates the second calculation result signal to generate the second integration result signal.

The eighth buffer signal O81 and the fifth buffer signal O51 are sent to the calculation unit OP1 for being performed with the arithmetic calculation.

The first to eighth gain parameters may be determined according to a frequency of the input signal IN, so as to dynamically adjust a center frequency of the noise transfer function of the delta-sigma modulator 301 for generating the modulating result signal OUT.

Moreover, transfer functions of the integrators INT1 and INT2 are respectively $1/(Z-1)$ and $Z/(Z-1)$, and the calculation units OP1 to OP3 may be adders.

Figure 3C:
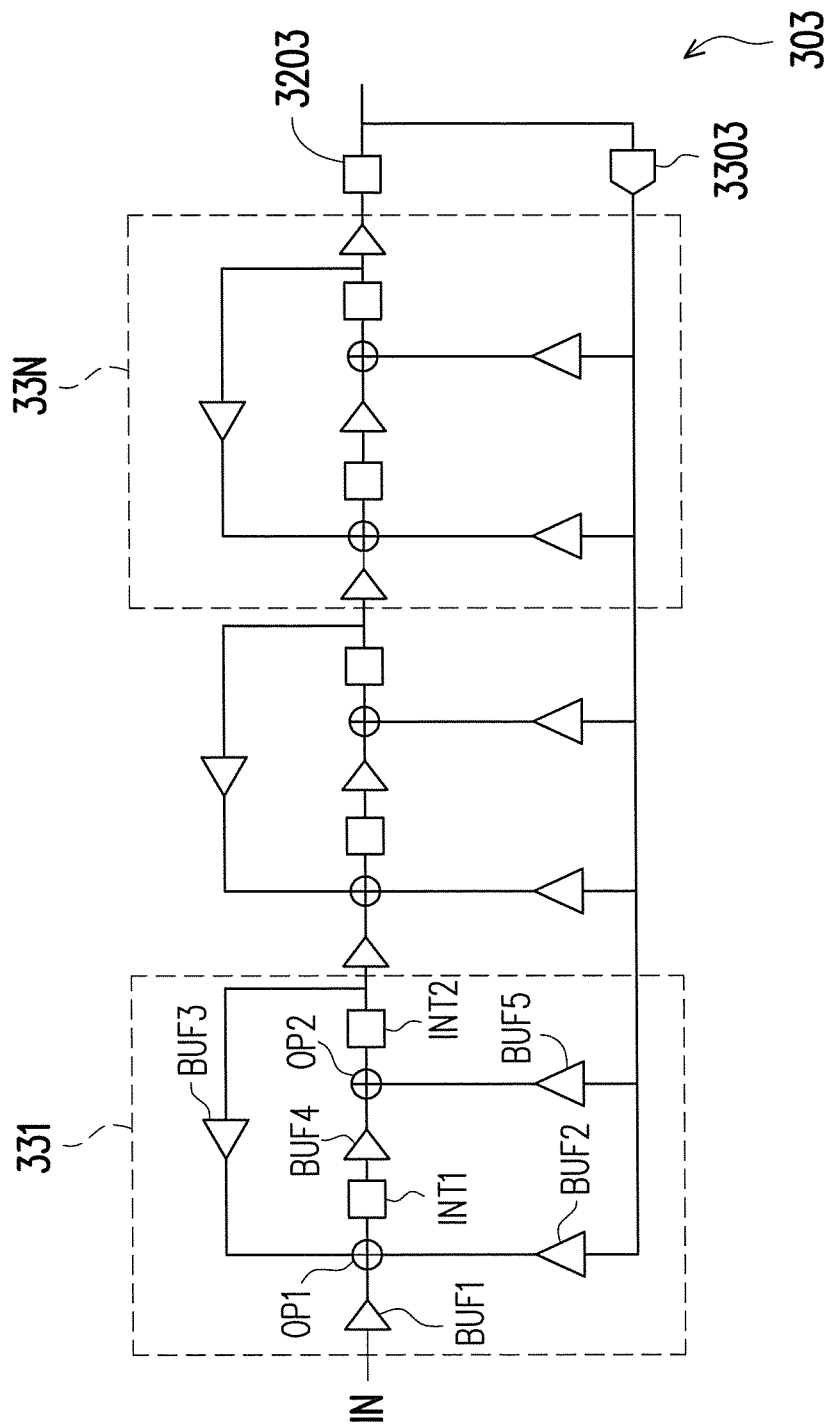
FIG. 3C is a schematic diagram illustrating a delta-sigma modulator according to still another embodiment of the invention.

Referring to FIG. 3C, FIG. 3C is a schematic diagram illustrating a delta-sigma modulator according to still another embodiment of the invention. The delta-sigma modulator 303 includes N integrating units 331 to 33N, a quantizer 3203 and a digital-to-analog converter 3303.

Regarding the implementation of each of the integrating units 331 to 33N, taking the integrating unit 331 for an example, the integrating unit 331 includes buffers BUF1 to BUF5, calculation units OP1 and OP2 and integrators INT1 and INT2. The buffer BUF1 adjusts a signal according to a first gain parameter for generating a first buffer signal, wherein the buffer BUF1 of the first stage integrating unit 331 adjusts an input signal IN, and the buffer BUF1 of the non-first integrating unit adjust a second integration result signal generated by the integrator INT2 of the prior stage integrating unit.

The calculation unit OP1 performs an arithmetic calculation on the first buffer signal, a second buffer signal generated by the buffer BUF2 and a third buffer signal generated by the buffer BUF3 so as to generate a first calculation result signal, wherein the second buffer signal is being generated as the buffer BUF2 adjusts a modulating result signal OUT according to a second gain parameter, and the third buffer signal is being generates as the buffer BUF3 adjusts the second integration result signal according to a third gain parameter.

Moreover, the integrator INT1 receives the first calculation result signal to perform an integration, so as to generate a first integration result signal. The buffer BUF5 adjusts the first integration result signal according to a fifth gain parameter for generating a fifth buffer signal. The calculation unit OP2 perform is an arithmetic calculation on the fourth buffer signal and the fifth buffer signal so as to generate a second calculation result signal. The integrator INT2 integrates the second calculation result signal to generate the second integration result signal. In addition, the second integration result signal may be provided to the next stage integrating unit or the quantizer 3203.

The calculation units OP1 and OP2 may be adders, and the transfer functions of the integrators INT1 and the INT2 may respectively be $Z/(Z-1)$ and $1/(Z-1)$.

Similar to the previous embodiment, the first to fifth gain parameters may be dynamically adjusted according to a frequency of the input signal IN, and thereby adjust a position of a center frequency of a noise transfer function of the delta-sigma modulator 303.

In the embodiments shown in FIG. 3A to FIG. 3C, an amount of the integrating units may be adjusted by the designer based on the actual requirements, wherein the amount of the integrating units may at least be one.

Figure 4A:
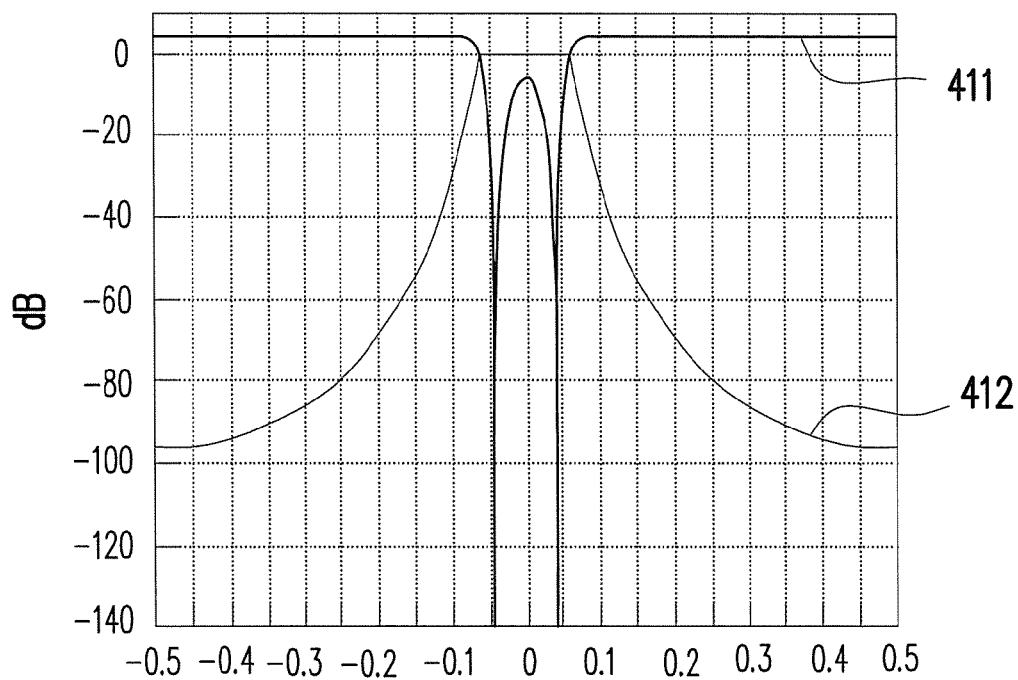
FIG. 4A and FIG. 4B respectively illustrate the spectrograms corresponded to different gain parameters in the embodiment depicted by FIG. 3C.
Figure 4B:
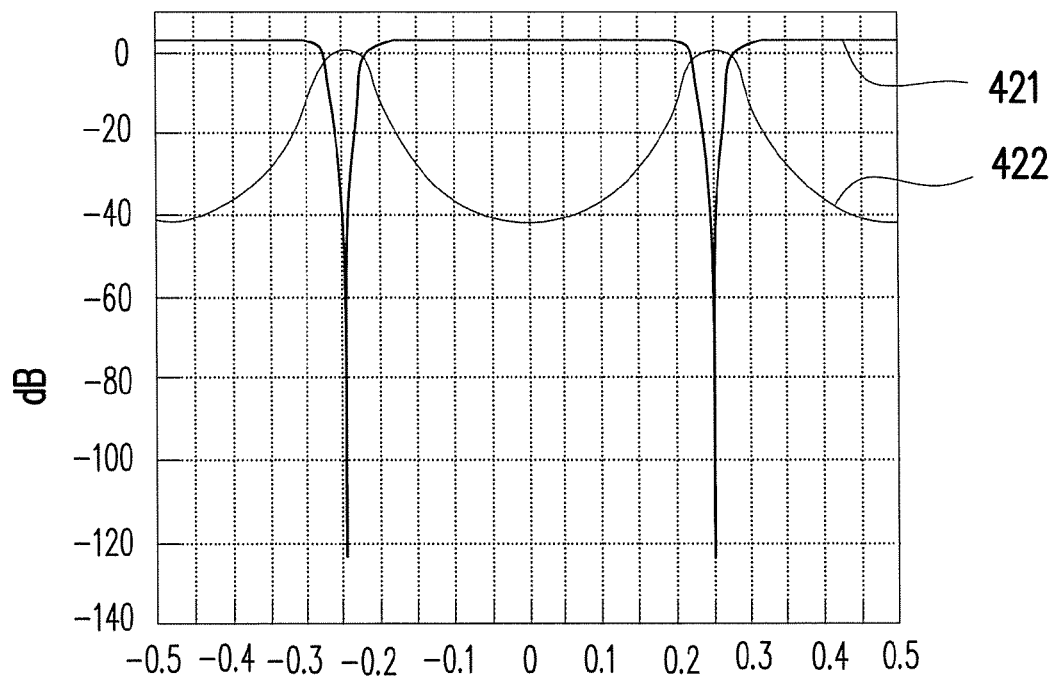

Referring to FIG. 4A and FIG. 4B, FIG. 4A and FIG. 4B respectively illustrate the spectrograms corresponded to the different gain parameters in the embodiment depicted by FIG. 3C. In FIG. 4A, through the adjustments of the gain parameters, the center frequency of the noise transfer function is adjusted to ½₄ of the sampling frequency, and a signal transfer curve 412 and a noise transfer curve 411 thereof are respectively as shown in FIG. 4A. In FIG. 4B, through the adjustments of the different the gain parameters, the center frequency of the noise transfer function is adjusted to ¼ of the sampling frequency, and a signal transfer curve 422 and a noise transfer curve 421 thereof are respectively as shown in FIG. 4B.

Figure 5:
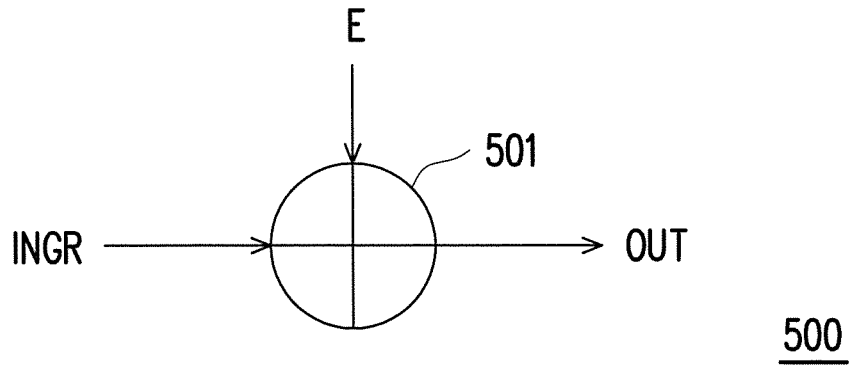
FIG. 5 is a schematic diagram illustrating an implementation of a quantizer according to an embodiment of the invention.

Referring to FIG. 5, FIG. 5 is a schematic diagram illustrating an implementation of a quantizer 500 according to an embodiment of the invention. The quantizer 500 includes a calculation unit 501, and the calculation unit 501 receives an integration result signal INGR generated by the integrating unit and an error signal E for performing an arithmetic calculation, so as to generate a modulating result signal OUT, wherein the calculation unit 501 may be an adder.

Figure 6:
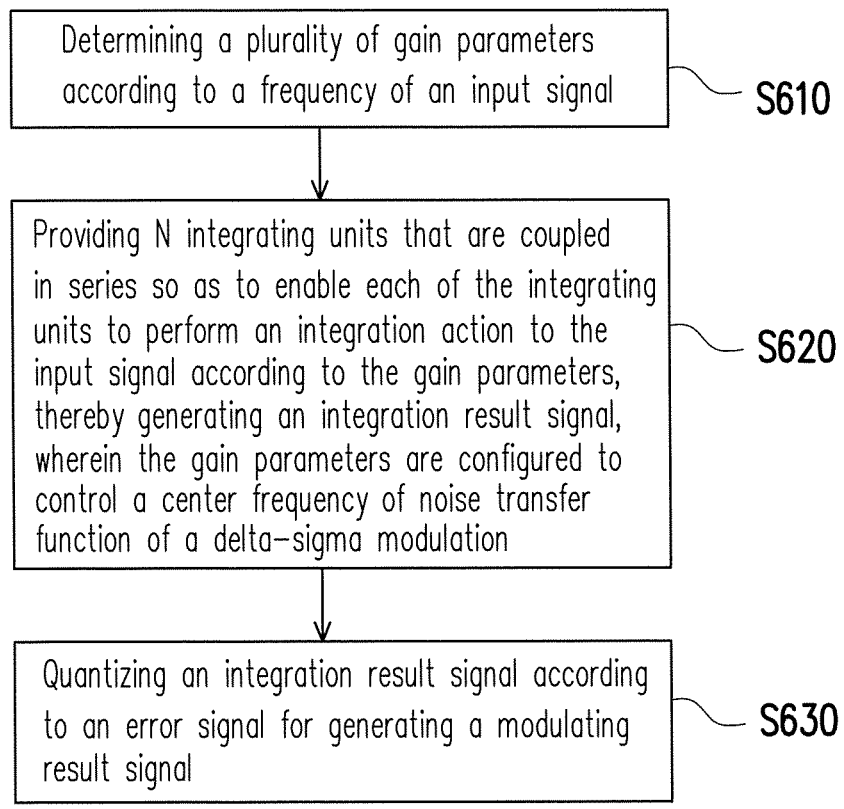
FIG. 6 is a flow chart illustrating a delta-sigma modulating method according to an embodiment of the invention.

Referring to FIG. 6, FIG. 6 is a flow chart illustrating a delta-sigma modulating method according to an embodiment of the invention, wherein the steps thereof include: in step S610, determining a plurality of gain parameters according to a frequency of an input signal; in step S620, providing N integrating units that are coupled in series so as to enable each of the integrating units to perform an integration action to the input signal according to the gain parameters, thereby generating an integration result signal, wherein the gain parameters are configured to control a center frequency of noise transfer function of a delta-sigma modulation; and in step S630, quantizing an integration result signal according to an error signal for generating a modulating result signal, wherein N is a positive integer.

Descriptions and implementation details regarding the steps of the present embodiment are provided in the previous embodiments and implementations, and thus are not to be repeated.

Figure 7:
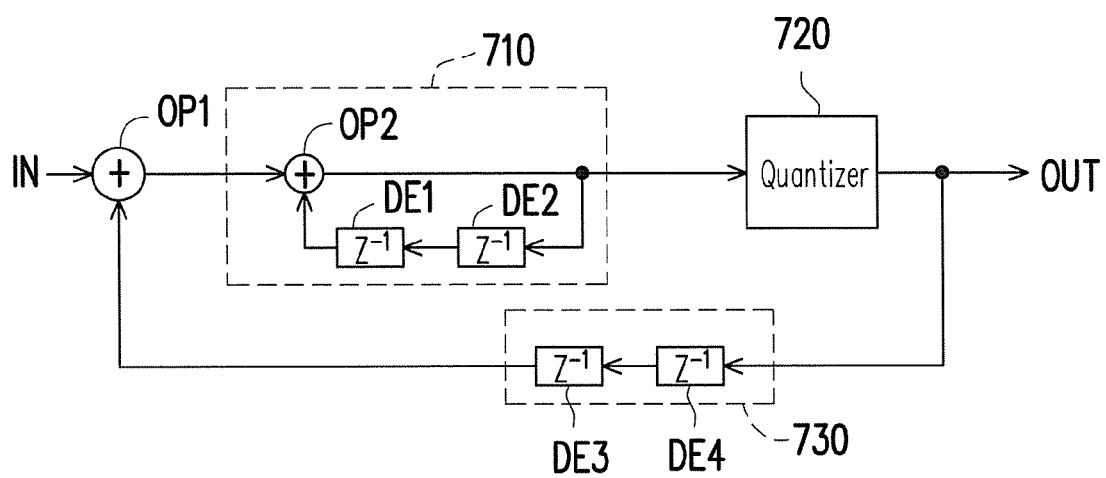
FIG. 7 is a schematic diagram illustrating a delta-sigma modulator according to another embodiment of the invention.

Referring to FIG. 7, FIG. 7 is a schematic diagram illustrating a delta-sigma modulator 700 according to another embodiment of the invention. The delta-sigma modulator 700 includes a calculation unit OP1, an integrating units 710, a quantizer 720, and a feedback delay unit 730. The calculation unit OP1 perform is an arithmetic calculation on an input signal IN and a modulating result signal OUT so as to obtain a calculation result signal. The integrating units 710 includes a calculation unit OP2 and a plurality of delay devices DE1 and DE2. The calculation unit OP2 generates in integration signal in response to the calculation result signal generated by the calculation unit OP1 and a delayed integration signal, and provides the integration signal to the quantizer 720. The delayed integration signal is being generated as the delay devices DE1 and DE2 perform delay the integration signal, wherein an amount of the delay devices DE1 and DE2 may be changed, but must be greater than or equal to 2.

The calculation unit OP2 may subtract the delayed integration signal from the calculation result signal generated by the calculation unit OP1 to generate the integration signal, and the calculation unit OP1 may subtract the modulating result signal OUT from the input signal IN to generate the calculation result signal.

Moreover, the feedback delay unit 730 is coupled between an output end of the quantizer 720 and an input end of the calculation unit OP1. The feedback delay unit 730 includes a plurality of delay devices DE3 and DE4 that are coupled in series, and provides the delayed modulating result signal OUT to the calculation unit OP1.

Noteworthily, with the configuration of the delay devices DE1 and DE2, in the invention enables a first-order low-pass delta-sigma modulator, which originally only has a single delay device, to perform a Z to $-Z^K$ conversion (K equals an amount of the delay devices; and in the present embodiment, K=2), and thus may achieve the adjustment of the center frequency of the noise transfer function of the delta-sigma modulator.

Referring to FIG. 8, FIG. 8 is a schematic diagram illustrating a touch control detection system 800 according to an embodiment of the invention. The touch control detection system 800 includes a touch sensor 810, an analog front-end element 820, a delta-sigma modulator 830, a demodulator 840, and a processor 850. The touch sensor 810 detects a touch action on a touch panel to generate a touch detection signal. The analog front-end element 820 is coupled to the touch sensor 810, and receives the touch detection signal for generating an input signal IN. The delta-sigma modulator 830 receives the input signal IN to perform a modulation and an analog to digital converting action, so as to generate a modulating result signal. The demodulator 840 is coupled to the delta-sigma modulator 830 for performing a demodulating action to the modulating result signal. The processor 850 receives and processes a signal generated by the demodulator 840, thereby producing various functions corresponding to the touch actions.

Herein, the delta-sigma modulator 830 may adopt the implementations of the delta-sigma modulators in the previous embodiments; and by means of adjusting the center frequency of the noise transfer function thereof, the delta-sigma modulator 830 may ensure that an over sampling ratio is maintained at a certain level under a condition of not requiring to perform a frequency multiplication on the input signal IN.

Referring to FIG. 9, FIG. 9 is a schematic diagram illustrating a touch control detection system 900 according to another embodiment of the invention. the touch control detection system 900 includes a touch sensor 910, an analog front-end element 920, a delta-sigma modulator 930, a demodulator 940, a processor 950, and a mixer 960. Different from the previous embodiments, the present embodiment further includes a mixer 960. The mixer 960 mixes the input signal IN with a local clock signal LF, so as to enable a center frequency of a noise transfer function of the delta-sigma modulator 930 to be adjusted in advance, thereby also ensuring that an over sampling ratio may be maintained at a certain level under a condition of not requiring to perform a frequency multiplication on the input signal M.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A delta-sigma modulator, comprising:
a quantizer, generating a modulating result signal;
N integrating circuits, coupled in series, a first stage integrating circuit receiving an input signal, an output end of a $N^{th}$ stage integrating circuit coupled to an input end of the quantizer, each of the integrating circuits receiving a plurality of gain parameters, and N being a positive integer,
wherein, the quantizer quantizes a signal on the output end of the $N^{th}$ stage integrating circuit according to an error signal for generating a modulating result signal, a center frequency of a noise transfer function of the delta-sigma modulator is adjusted according to the gain parameters for generating the modulating result signal, and the gain parameters are determined according to a frequency of the input signal; and
a gain parameter generator, receiving the input signal and generating all of the gain parameters according to the frequency of the input signal,
wherein each of the integrating circuits comprises:
a first buffer, adjusting a signal according to a first gain parameter for generating a first buffer signal;
a first calculation circuit, executing an arithmetic calculation on the first buffer signal, a second buffer signal and a third buffer signal for generating a first calculation result signal;
a first integrator, receiving the first calculation result signal for performing an integration, so as to generate a first integration result signal;
a second buffer, adjusting the modulating result signal according to a second gain parameter for generating the second buffer signal;
a third buffer, adjusting a second integration result signal according to a third gain parameter for generating the third buffer signal;
a fourth buffer, adjusting the first integration result signal according to a fourth gain parameter for generating a fourth buffer signal;
a fifth buffer, adjusting the first integration result signal according to a fifth gain parameter for generating a fifth buffer signal;
a second calculation circuit, executing an arithmetic calculation on the fourth buffer signal and the fifth buffer signal for generating a second calculation result signal; and
a second integrator, integrating the second calculation result signal to generate the second integration result signal,
wherein the second integration result signal is provided to the next stage integrating circuit or the quantizer.

2. The delta-sigma modulator as recited in claim 1, wherein the signal is the second integration result signal of the prior stage integrating circuit or the input signal.

3. The delta-sigma modulator as recited in claim 1, wherein the quantizer comprises:
a third calculation circuit, performing an arithmetic calculation the signal on the output end of the $N^{th}$ stage integrating circuit and the error signal so as to generate the modulating result signal.

4. The delta-sigma modulator as recited in claim 3, further comprising:
a digital-to-analog converter, converting the modulating result signal of analog format into digital format, and transmitting the modulating result signal of digital format to the integrating circuits.

5. A touch control detection system, comprising:
A touch sensor, generating a touch detection signal;
an analog front-end element, coupled to the touch sensor, receiving the touch detection signal and generating an input signal;
a delta-sigma modulator, as claimed in claim 1, coupled to the analog front-end element for receiving the input signal, and generating the modulating result signal; and
a demodulator, coupled to the delta-sigma modulator for performing a demodulating action to the modulating result signal.

6. The touch control detection system as recited in claim 5, further comprising:
a mixer, coupled on a coupling path between the analog front-end element and the delta-sigma modulator, and performing a mixing action on the input signal according to a local clock signal.

7. A delta-sigma modulator, comprising:
a quantizer, generating a modulating result signal;
N integrating circuits, coupled in series, a first stage integrating circuit receiving an input signal, an output end of a Nth stage integrating circuit coupled to an input end of the quantizer, each of the integrating circuits receiving a plurality of gain parameters, and N being a positive integer,
wherein, the quantizer quantizes a signal on the output end of the Nth stage integrating circuit according to an error signal for generating a modulating result signal, a center frequency of a noise transfer function of the delta-sigma modulator is adjusted according to the gain parameters for generating the modulating result signal, and the gain parameters are determined according to a frequency of the input signal;
a gain parameter generator, receiving the input signal and generating all of the gain parameters according to the frequency of the input signal;
a first buffer, adjusting the input signal according to a first gain parameter for generating a first buffer signal; and
a first calculation circuit, performing an arithmetic calculation on the first buffer signal and the signal on the output end of the $N^{th}$ stage integrating circuit to generate an integration result signal,
wherein each of the integrating circuits comprises:
a second buffer, adjusting the input signal according to a second gain parameter for generating a second buffer signal;
a third buffer, adjusting the modulating result signal according to a third gain parameter for generating a third buffer signal;
a second calculation circuit, performing an arithmetic calculation on the second and the third buffer signals, a seventh buffer signal and an eighth buffer signal of the prior stage integrating circuit to generate a first calculation result signal;
a first integrator, integrating the first calculation result signal to generate a first integration result signal;
a fourth buffer, adjusting the first integration result signal according to a fourth gain parameter for generating a fourth buffer signal;
a third calculation circuit, performing arithmetic calculation on the fourth buffer signal, a fifth buffer signal and a sixth buffer signal to generate a second calculation result signal;
a fifth buffer, adjusting the input signal according to a fifth gain parameter for generating the fifth buffer signal;

a sixth buffer, adjusting the modulating result signal according to a sixth gain parameter for generating the sixth buffer signal;

a second integrator, integrating the second calculation result signal to generate a second integration result signal;

a seventh buffer, adjusting the second integration result signal according to a seventh gain parameter for generating the seventh buffer signal; and an eighth buffer, adjusting the second integration result signal according to an eighth gain parameter for generating the eighth buffer signal, wherein the eighth buffer signal is provided to the second calculation circuit of the next stage integrating circuit or the quantizer.

8. A delta-sigma modulator, comprising:

a quantizer, generating a modulating result signal;

N integrating circuits, coupled in series, a first stage integrating circuit receiving an input signal, an output end of a $N^{th}$ stage integrating circuit coupled to an input end of the quantizer, each of the integrating circuits receiving a plurality of gain parameters, and N being a positive integer, wherein, the quantizer quantizes a signal on the output end of the $N^{th}$ stage integrating circuit according to an error signal for generating a modulating result signal, a center frequency of a noise transfer function of the delta-sigma modulator is adjusted according to the gain parameters for generating the modulating result signal, and the gain parameters are determined according to a frequency of the input signal;

a gain parameter generator, receiving the input signal and generating all of the gain parameters according to the frequency of the input signal;

a first buffer, adjusting the input signal according to a first gain parameter for generating a first buffer signal; and a first calculation circuit, performing an arithmetic calculation on the first buffer signal and the fifth and the eighth buffer signals of each of the integrating circuits to generate the integration result signal;

wherein each of the integrating circuits comprises:

a second buffer, adjusting the input signal according to a second gain parameter for generating a second buffer signal;

a third buffer, adjusting the modulating result signal or a second integration result signal of the prior stage integrating circuit according to a third gain parameter for generating a third buffer signal;

a second calculation circuit, performing an arithmetic calculation on the second and the third buffer signals and a seventh buffer signal to generate a first calculation result signal;

a first integrator, integrating the first calculation result signal to generate a first integration result signal;

a fourth buffer, adjusting the first integration result signal according to a fourth gain parameter for generating a fourth buffer signal;

a fifth buffer, adjusting the first integration result signal according to a fifth gain parameter for generating the fifth buffer signal;

a sixth buffer, adjusting the input signal according to a sixth gain parameter for generating the sixth buffer signal;

a third calculation circuit, performing an arithmetic calculation on the fourth buffer signal and the sixth buffer signal to generate a second calculation result signal;

a second integrator, integrating the second calculation result signal to generate a second integration result signal;

a seventh buffer, adjusting the second integration result signal according to a seventh gain parameter for generating the seventh buffer signal; and an eighth buffer, adjusting the second integration result signal according to a eighth gain parameter for generating the eighth buffer signal, wherein the eighth buffer signal is provided to the second calculation circuit of the next stage integrating circuits or the quantizer.

* * * * *